United States Patent
Song et al.

(10) Patent No.: US 7,947,986 B2
(45) Date of Patent: May 24, 2011

(54) THIN FILM TRANSISTOR SUBSTRATE AND MANUFACTURING METHOD THEREOF

(75) Inventors: Keun-kyu Song, Yongin-si (KR); Young-min Kim, Yongin-si (KR); Tae-young Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/692,560

(22) Filed: Jan. 22, 2010

(65) Prior Publication Data

US 2010/0127252 A1    May 27, 2010

Related U.S. Application Data

(62) Division of application No. 11/491,013, filed on Jul. 21, 2006, now Pat. No. 7,675,067.

(30) Foreign Application Priority Data

Jul. 25, 2005 (KR) .............................. 2005-0067516

(51) Int. Cl.
H01L 27/12 (2006.01)
(52) U.S. Cl. ................................. 257/72; 257/E27.111
(58) Field of Classification Search .................... 257/40, 257/49, 50, 51, 52, 57, 58, 59, 66, 72, 75, 257/E27.111, E27.112
See application file for complete search history.

(56) References Cited

U.S. PATENT DOCUMENTS

| | | | | |
|---|---|---|---|---|
| 4,905,066 A | * | 2/1990 | Dohjo et al. | .................... 257/60 |
| 7,005,674 B2 | | 2/2006 | Lee et al. | |
| 2001/0015438 A1 | | 8/2001 | Callegari et al. | |
| 2002/0053669 A1 | | 5/2002 | Suzawa et al. | |
| 2004/0079937 A1 | * | 4/2004 | Miyazawa | ....................... 257/10 |
| 2004/0095544 A1 | * | 5/2004 | Chang et al. | .................. 349/152 |
| 2004/0263709 A1 | | 12/2004 | Kim | |

(Continued)

FOREIGN PATENT DOCUMENTS

JP    7-176749    7/1995

(Continued)

OTHER PUBLICATIONS

Fujisaki, et al; Entitled: "Liquid Crystal Display Cells Fabricated on Plastic Substrate Driven by Low-Voltage Organic Thin-Film Transistor with Improved Gate Insulator and Passivation Layer". JJAP vol. 44, No. 6A, 2005, pp. 3728-3732.

(Continued)

Primary Examiner — Minh-Loan T Tran
Assistant Examiner — Kevin Quinto
(74) Attorney, Agent, or Firm — Innovation Counsel LLP

(57) ABSTRACT

Embodiments of the invention provide a thin film transistor substrate, comprising: an insulating substrate; a gate wire formed on the insulating substrate; a first gate insulating layer made of an inorganic material, formed on the gate wire and having a first insulating layer contact hole for exposing at least a part of the gate wire; a second gate insulating layer made of an organic material, formed on the first gate insulating film and having a second insulating layer contact hole corresponding to the first insulating layer contact hole; a source electrode and a drain electrode formed on the second gate insulating layer and being aparted from each other to be defining a channel area; and an organic semiconductor layer formed on the channel area.

Accordingly, the present invention provides an organic TFT substrate in which a characteristic of a TFT is improved.

9 Claims, 17 Drawing Sheets

U.S. PATENT DOCUMENTS

2005/0053720 A1 * 3/2005 Yamazaki et al. .............. 427/69

FOREIGN PATENT DOCUMENTS

| | | |
|---|---|---|
| JP | 2000-340801 | 12/2000 |
| JP | 2001-244473 | 9/2001 |
| JP | 2003-195354 | 7/2003 |
| JP | 2004-241528 | 8/2004 |
| JP | 2004-241528 A | 8/2004 |
| JP | 2005-051199 | 2/2005 |
| KR | 2002-0034873 A | 5/2002 |
| KR | 2002-0077075 A | 10/2002 |
| KR | 2004-0078548 A | 9/2004 |
| KR | 2004-0084488 A | 10/2004 |
| KR | 10-2005-0004565 | 1/2005 |
| TW | 385506 | 3/2000 |
| TW | 432720 | 5/2001 |
| TW | 468075 | 12/2001 |
| TW | 499596 | 8/2002 |
| TW | 229383 | 4/2004 |
| TW | 236173 | 7/2004 |

OTHER PUBLICATIONS

Patent Abstracts of Japan, Publication No. 07-176749, Jul. 14, 1995, 1 p.
Patent Abstracts of Japan, Publication No. 2004-241528, Aug. 26, 2004, 1 p.
Korean Patent Abstracts, 1020050004565, Jan. 12, 2005, 1 p.

* cited by examiner

THIN FILM TRANSISTOR SUBSTRATE AND MANUFACTURING METHOD THEREOF

CROSS-REFERENCE TO RELATED APPLICATIONS

This application is a divisional of U.S. patent application Ser. No. 11/491,013, filed on Jul. 21, 2006, which claims priority from Korean Patent Application No. 2005-0067516, filed on Jul. 25, 2005, in the Korean Intellectual Property Office, the disclosure of which is incorporated herein by reference.

BACKGROUND OF INVENTION

1. Field of Invention

The present invention relates to a thin film transistor ("TFT") substrate, and more particularly, to a TFT substrate in which an organic semiconductor layer is provided.

2. Description of the Related Art

A TFT substrate includes a TFT as a switching and driving device for controlling and driving the operation of each pixel. The TFT includes a semiconductor layer, and the semiconductor layer is generally formed of amorphous silicon or polysilicon. However, an organic semiconductor material has recently been substituted for the semiconductor layer.

Since organic semiconductor materials can be formed at room temperature and atmospheric pressure, they may provide a number of advantages. For example, the fabricating cost may be reduced, and the organic semiconductor material may be applied to a plastic substrate which is susceptible to heat damage. However, the organic semiconductor material has disadvantages as well; for example, it has low chemical resistance and plasma resistance.

An organic TFT including an organic semiconductor material as described above includes an insulating substrate, a gate electrode formed on the insulating substrate, a gate insulating film covering the gate electrode and formed of an organic material, source and drain electrodes which are separated by the gate electrode so as to define a channel area, an organic semiconductor layer formed in the channel area, a first passivation layer formed on the organic semiconductor layer, and a second passivation layer formed on the first passivation layer and containing aluminum.

However, since the organic TFT is composed of only a single layer of the gate insulating film, the gate insulating film may not provide sufficient insulation between the data wire and the gate wire. Due to such an insulation defect, the hysteresis width of the TFT is increased, and thus the organic TFT has poor reproducibility. Additionally, the second passivation layer (typically containing aluminum) has a large stress with respect to the first passivation layer on which it is formed, thereby causing an effect referred to as "lifting." The lifting effect may also deteriorate the hysteresis characteristic of organic TFT structures.

SUMMARY OF THE INVENTION

Accordingly, it is an aspect of the present invention to provide an organic TFT substrate in which one or more performance characteristics of a TFT such as a hysteresis characteristic of a TFT are improved.

It is another aspect of the present invention to provide a method of fabricating an organic TFT substrate in which one or more characteristics of the TFT are improved.

Additional features of the invention will be set forth in the description which follows, and in part will be apparent from the description, or may be learned by practice of the invention.

The foregoing and/or other aspects of the present invention can be achieved by providing a thin film transistor substrate comprising: an insulating substrate; a gate wire formed on the insulating substrate; a first gate insulating layer comprising an inorganic material, formed on the gate wire and having a first insulating layer contact hole to expose at least a part of the gate wire; a second gate insulating layer comprising an organic material, formed on the first gate insulating film and having a second insulating layer contact hole positioned corresponding to the first insulating layer contact hole; a source electrode and a drain electrode formed on the second gate insulating layer and separated from each other to define a channel area; and an organic semiconductor layer formed in the channel area.

According to an aspect of the present invention, the first gate insulating layer contains at least one of $SiO_x$ and $SiN_x$.

According to an aspect of the present invention, the second gate insulating layer comprises at least one of Si polymer, azobis isobutiro nitrile (AIBN), tetra butyl ortho titanate (Ti $(OBu)_4$) and butanol.

According to an aspect of the present invention, the gate wire comprises a gate line extending in one direction on the insulating substrate, a gate pad formed at an end of the gate line, a gate electrode formed at a position corresponding to the organic semiconductor layer, and a connector covering the first and second insulating layer contact holes.

According to an aspect of the present invention, the thin film transistor substrate further comprises a data wire formed between the insulating substrate and the gate wire, wherein the data wire includes a data line crossing the gate line and defining a pixel area, and a data pad formed at an end of the data line.

According to an aspect of the present invention, the data wire further comprises a light shielding layer formed at a position corresponding to the gate electrode, to cover the organic semiconductor layer.

According to an aspect of the present invention, the thin film transistor substrate further comprises a first buffer layer formed between the data wire and the gate wire and having a first buffer layer contact hole to expose at least a part of the data line and the data pad.

According to an aspect of the present invention, the first buffer layer comprises at least one of $SiO_x$ and $SiN_x$.

According to an aspect of the present invention, the thin film transistor substrate further comprises a second buffer layer comprising at least one of acrylic-based resin, polyvinyl alcohol, benzocyclobutene, polyvinyl phenolic-based resin, fluoric-based polymer, and polystyrene resin.

According to an aspect of the present invention, the second buffer layer is formed with a second buffer layer contact hole to expose the data line.

According to an aspect of the present invention, the thin film transistor substrate further comprises a data pad contact connected with the data pad through the connecting member, and a gate pad contact covering the gate pad exposed by the first and second insulating layer contact holes.

According to an aspect of the present invention, the source electrode, the drain electrode, the data pad contact and the gate pad contacting member are formed on a same layer, and contain at least one of indium tin oxide (ITO) and indium zinc oxide (IZO).

According to an aspect of the present invention, the thin film transistor substrate further comprises a passivation layer covering the organic semiconductor layer.

The foregoing and/or other aspects of the present invention can be achieved by providing a thin film transistor substrate comprising: an insulating substrate; a gate wire formed on the insulating substrate; a gate insulating layer formed on the gate wire and having an insulating layer contact hole to expose at least a part of the gate wire; a source electrode and a drain electrode formed on the gate insulating layer and being separated from each other to define a channel area; an organic semiconductor layer formed in the channel area; a first passivation layer formed on the organic semiconductor layer and comprising of fluoric-based polymer; and a second passivation layer formed on the first passivation layer and made of a transparent electrode material.

According to an aspect of the present invention, the second passivation layer comprises at least one of ITO and IZO.

According to an aspect of the present invention, the gate wire comprises a gate line extending in one direction on the insulating substrate, a gate pad formed at an end of the gate line, a gate electrode formed at a position corresponding to the organic semiconductor layer, and a connector covering the first and second insulating layer contact holes.

According to an aspect of the present invention, the thin film transistor substrate further comprises a data wire formed between the insulating substrate and the gate wire, wherein the data wire includes a data line crossing the gate line and defining a pixel area, and a data pad formed at an end of the data line.

According to an aspect of the present invention, the thin film transistor substrate further comprises a first buffer layer comprising an inorganic material formed between the data wire and the gate wire and having a first buffer layer contact hole to expose at least a part of the data line and the data pad.

According to an aspect of the present invention, the thin film transistor substrate further comprises a second buffer layer comprising an organic material formed between the first buffer layer and the gate wire, and having a second buffer layer contact hole to expose the data line.

According to an aspect of the present invention, the thin film transistor substrate further comprises a data pad contact connected with the data pad through the connector, and a gate pad contact covering the gate pad exposed by the first and second insulating layer contact holes.

The foregoing and/or other aspects of the present invention can be achieved by providing a thin film transistor substrate comprising: an insulating substrate; a gate wire formed on the insulating substrate; a first gate insulating layer comprising an inorganic material formed on the gate wire and having a first insulating layer contact hole to expose at least a part of the gate wire; a second gate insulating layer comprising an organic material formed on the first gate insulating layer and having a second insulating layer contact hole positioned corresponding to the first insulating layer contact hole; a source electrode and a drain electrode formed on the second gate insulating layer and being separated from each other to define a channel area; an organic semiconductor layer formed in the channel area; a first passivation layer formed on the organic semiconductor layer and comprising fluoric-based polymer; and a second passivation layer formed on the first passivation layer and comprising a transparent conductive material.

The foregoing and/or other aspects of the present invention can be achieved by providing a method for fabricating a thin film transistor substrate comprises the acts of: providing an insulating substrate; forming a gate wire on the insulating substrate; forming a first gate insulating layer comprising an inorganic material and having a first insulating layer contact hole to expose at least a part of the gate wire on the gate wire; forming a second gate insulating layer comprising an organic material and having a second insulating layer contact hole positioned corresponding to the first insulating layer contact hole on the first gate insulating layer; forming a source electrode and a drain electrode separated from each other and defining a channel area on the second gate insulating film; and forming an organic semiconductor layer in the channel area.

According to an aspect of the present invention, the first gate insulating layer comprises at least one of $SiO_x$ and $SiN_x$.

According to an aspect of the present invention, the second gate insulating layer comprises at least one of Si polymer, azobis isobutiro nitrile (AIBN), tetra butyl ortho titanate (Ti$(OBu)_4$) and butanol.

According to an aspect of the present invention, the method further comprises a step of forming a passivation layer on the organic semiconductor layer.

According to an aspect of the present invention, the gate wire comprises a gate line extending in one direction on the insulating substrate, a gate pad formed at an end of the gate line, a gate electrode formed at a position corresponding to the organic semiconductor layer, and a connector covering the first and second insulating layer contact holes.

According to an aspect of the present invention, the method further comprises forming a data wire between the insulating substrate and the gate wire, wherein the data wire includes a data line crossing the gate line and defining a pixel area, and a data pad formed at an end of the data line.

According to an aspect of the present invention, the method further comprises a step of forming a buffer layer between the data wire and the gate wire, the buffer layer having a buffer layer contact hole to expose at least a part of the data line and the data pad.

According to an aspect of the present invention, the method further comprises forming a data pad contact connected with the data pad through the connector, and a gate pad contact covering the gate pad exposed by the first and second insulating layer contact holes, when forming the source and drain electrodes.

According to an aspect of the present invention, the organic semiconductor layer is formed by an evaporation method.

According to an aspect of the present invention, the organic semiconductor layer is formed by an inkjet method.

The foregoing and/or other aspects of the present invention can be achieved by providing a method for fabricating a thin film transistor substrate, comprising the acts of: providing an insulating substrate; forming a gate wire on the insulating substrate; forming on the gate wire a gate insulating layer having an insulating layer contact hole to expose at least part of the gate wire; forming on the gate insulating layer a source electrode and a drain electrode separated from each other, the source electrode and the drain electrode defining a channel area; forming an organic semiconductor layer, a first passivation layer comprising fluoric-based polymer and a second passivation layer comprising a transparent conductive material, in turn, on the source and drain electrodes; patterning the second passivation layer to be correspondent to the channel area; and patterning the organic semiconductor layer and the first passivation layer using the second passivation layer.

According to an aspect of the present invention, the second passivation layer comprises at least one of ITO and IZO.

According to an aspect of the present invention, the organic semiconductor layer is formed by an evaporation method.

According to an aspect of the present invention, the second passivation layer is patterned to be locally positioned on the channel area by a photolithography process.

According to an aspect of the present invention, the organic semiconductor layer is formed by an inkjet method.

In general, in another aspect, a display apparatus comprises a substrate. The display apparatus further comprises an organic thin film transistor positioned on the substrate, where the organic thin film transistor comprises a drain region, a source region, and a channel region comprising an organic semiconductor material in communication with the drain region and the source region. The organic semiconductor material further includes a gate region positioned proximate the channel region, and a gate insulating region configured to substantially insulate the gate region from the channel region, the gate insulating region comprising a first substantially inorganic insulator material proximate the gate region and a second substantially organic insulator material proximate the first inorganic insulator material.

The display apparatus may further comprise a data wire configured to transmit a data signal to the organic thin film transistor and a gate wire configured to transmit a gate signal to the organic thin film transistor. The display apparatus may further include a buffer between the data wire and the gate wire and including a first buffer material and a second different buffer material. The first buffer material may comprise at least one of $SiO_x$ and $SiN_x$. The second buffer material may comprise at least one of acrylic-based resin, polyvinyl alcohol, benzocyclobutene, polyvinyl phenolic-based resin, fluoric-based polymer and polystyrene resin.

The substrate may be positioned in a display and configured to generate signals to drive the display using the organic thin film transistor. The display apparatus may further comprise the display, which may be a liquid crystal display.

It is to be understood that both the foregoing general description and the following detailed description are exemplary and explanatory and are intended to provide further explanation of the invention as claimed.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which:

FIGS. 3A, 3B, 3C, 3D, 3E, 3F, 3G, 3H, 3I, 3J and 3K are cross-sectional views sequentially showing a method for fabricating the TFT substrate according to the first embodiment of the present invention;

Figure 1:
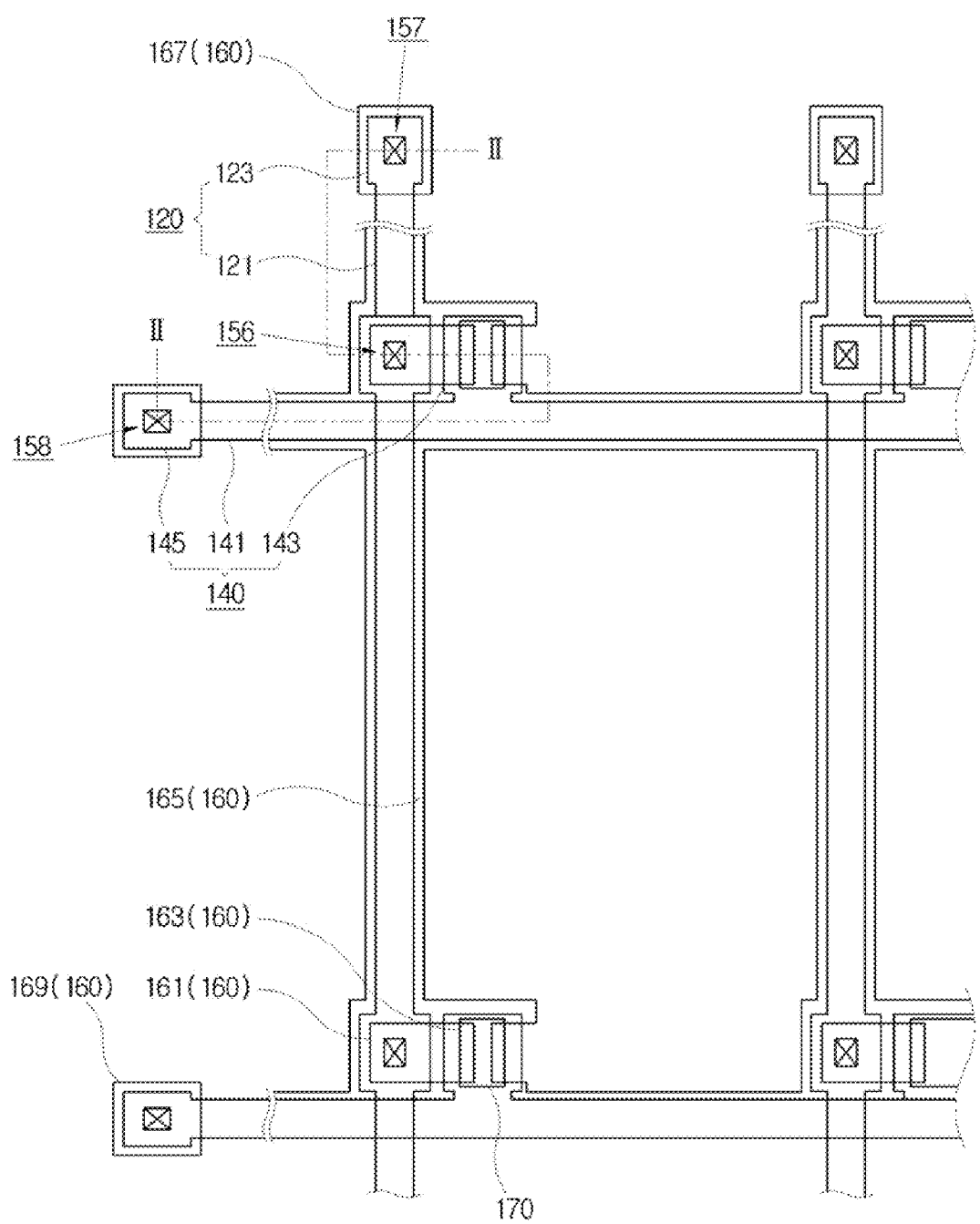
FIG. 1 is a plot plan view of a TFT substrate according to the first embodiment of the present invention.

DETAILED DESCRIPTION OF THE ILLUSTRATIVE, NON-LIMITING EMBODIMENTS OF THE INVENTION

Exemplary embodiments of the present invention will now be described in detail. The exemplary embodiments are illustrated in the accompanying drawings, wherein like reference numerals refer to like elements throughout. In the drawings, the thickness and size of layers, films, and regions are exaggerated for clarity. It will be understood that when an element such as a layer, film, region, or substrate is referred to as being (formed) "on" another element, it can be directly on the other element or intervening elements may also be present.

Figure 2:
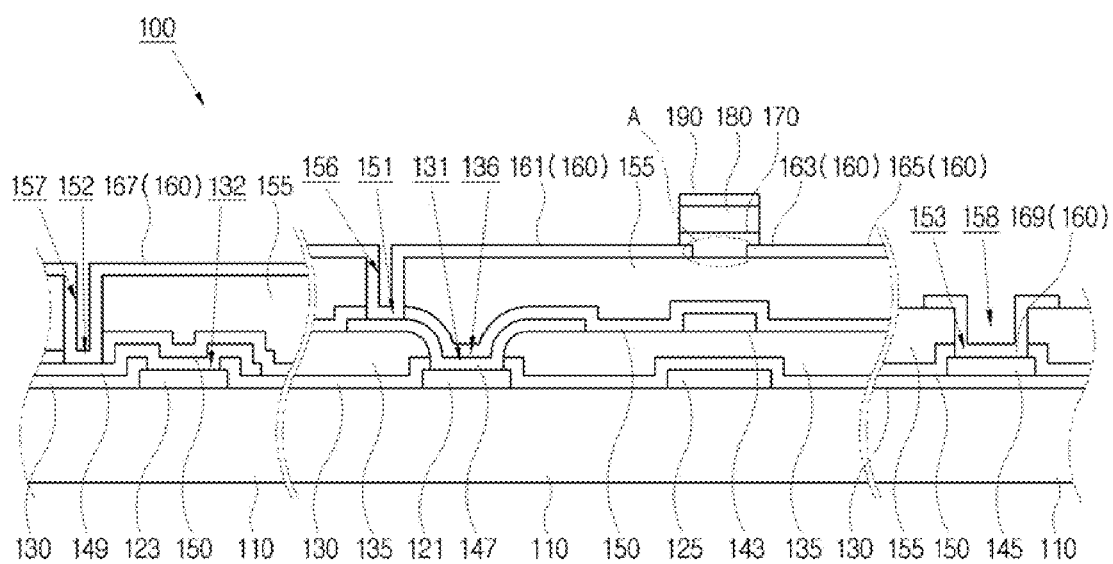
FIG. 2 is a cross-sectional view taken along line II-II of FIG. 1.

FIG. 1 is a plot plan view of a TFT substrate according to the first embodiment of the present invention, and FIG. 2 is a cross-sectional view taken along line II-II of FIG. 1.

A TFT substrate 100 of the first embodiment comprises an insulating substrate 110, a data wire 120 formed on the insulating substrate 110, first and second buffer films 130 and 135 formed, in turn, on the data wire 120, a gate wire 140 formed on the second buffer film 135, first and second gate insulating films 150 and 155 formed, in turn, on the gate wire 140, a transparent electrode layer 160 formed on the second gate insulating film 155, an organic semiconductor layer 170 formed on the second gate insulating film 155 while being in contact with at least a portion of the transparent electrode layer 160, and first and second passivation layers 180 and 190 formed, in turn, on the organic semiconductor layer 170.

In some embodiments, the insulating substrate 110 can be made of glass or plastic. Embodiments in which the insulating substrate 110 is formed of plastic are advantageous in that the TFT substrate 100 can be flexible. However, plastic also has a disadvantage that the insulating substrate 110 can be susceptible to heat damage. Embodiments described herein use an organic semiconductor layer that can be formed at room temperature and atmospheric pressure, so that insulating substrate 110 may made of a plastic material without the risk of heat damage. Examples of plastic materials that may be used for insulating substrate 110 include polycarbon, polyimide, PES, PAR, PEN, PET, etc.

The data wire 120 is formed on the insulating substrate 110. The data wire 120 comprises a data line 121 formed on the insulating substrate 110 extending in one direction, a data pad 123 formed at an end of the data line 121 to receive a driving or controlling signal from outside the substrate, and a light shielding film 125 formed at a position corresponding to a gate electrode 143 to shield the organic semiconductor layer 170. In some embodiments, the light shielding film 125 can be omitted.

The data pad 123 receives the driving and controlling signal from outside and supplies it to the data line 121. The data wire 120 may comprise at least one of Al, Cr, Mo and Nd which are relatively inexpensive and have good conductivity, and/or Au, Pt, Pd which are relatively expensive. The data wire 120 may have a single layer or a plurality of layers comprising at least one of the above-mentioned materials.

First and second gate insulating films 150 and 155 may be damaged by a chemical material used in the data wire forming process. Thus, according to embodiments of the present invention, the data wire 120 is formed, and then the first and second buffer films 130 and 135 are formed on data wire 120. This protects the first and second gate insulating films 150 and 155 from the chemical material and thus prevent a hysteresis characteristic of the organic semiconductor layer 170 from being unduly deteriorated.

The first buffer film 130 covers the data wire 120 on the insulating substrate 110. The first buffer film 130 may be formed of an inorganic material such as $SiN_x$ or $SiO_x$, etc., which has excellent workability, to electrically insulate the data wire 120 from the gate wire 140. The first buffer film 130 is formed with a first buffer film contact hole 131, 132 to expose the data line 121 and the data pad 123. Since the first buffer film 130 is formed of $SiN_x$ or $SiO_x$, it is possible to rework an outer lead bonding (OLB) operation of a gate pad 145 and the data pad 123.

The second buffer film 135 formed of an organic material is formed on the first buffer film 130. However, it is preferable that the second buffer film 135 is not formed proximate to the non-displaying region where the data pad 123 and the gate pad 145 are positioned If a thick organic film remains at the data pad 123 and the gate pad 145, a contact defect with a driving chip (not shown) may occur. The second buffer film 135 is formed with a second buffer film contact hole 136 to expose the data line 121. The second buffer film 135 may contain at least one of acrylic-based resin, polyvinyl alcohol, benzocyclobutene, polyvinyl phenolic-based resin, fluoric-based polymer, and polystyrene resin.

The first and second buffer films 130 and 135 reduce the characteristic damage of the organic semiconductor layer 170. Without first and second buffer films 130 and 135, the chemical material or plasma used in the data wire forming process may remain and flow into the organic semiconductor layer 170 through a gap between first and second buffer film contact holes 131, 132 and 136 and first and second insulating film contact holes 151, 152, 153, 156, 157 and 158 to be described below, or through an interface between the films. The chemicals or plasma may thereby attack the organic semiconductor layer 170 which has low chemical resistance and plasma resistance. The first and second buffer films 130 and 135 also function to prevent the light shielding film 125 from serving as a floating electrode.

The gate wire 140 is formed on the second buffer film 135. The gate wire 140 includes a gate line 141 formed to cross the data line 121, which is insulated from gate line 141. Adjacent gate lines 141 and data lines 121 define pixel areas. Gate wire 140 also includes a gate pad 145 formed at an end of the gate line 141 to receive a driving or controlling signal from the outside, a gate electrode 143 formed as a branch of the gate line 141 at a place corresponding to the organic semiconductor layer 170, and a connecting member (connector) 147, 149 which covers the data wire 120 exposed by the first buffer film contact hole 131, 132 and the buffer film 130, 135 around the exposed data wire 120.

The gate pad 145 receives the driving and controlling signal for controlling an ON/OFF action of the TFT from the outside and transmits it through the gate line 141 to the gate electrode 143. The connecting member 147, 149 functions to reduce a contact defect between a source electrode 161 and a data pad contacting member and the data wire 120. The contact defect is caused by a large step difference between the second buffer film contact hole 136 and the second insulating film contact hole 156, 157, which occurs because the second buffer film 135 is formed as a thick organic film and the second gate insulating film 155 is also thick. In other words, the connecting member 147, 149 is interposed between the data line 121 and a source electrode 161 and between the data pad 123 and a data pad contacting member (contact) 167, and the second insulating film contact hole 156, 157 is formed on the buffer film 130, 135 around the data wire 120 so that the step difference is reduced. As a result, the source electrode 161 and the data pad contacting member 167 properly contact the data wire 120.

The gate wire 140 may also contain at least one of Al, Cr, Mo, Nd, Au, Pt, Pd, etc., and may have a single layer or a plurality of layers.

The first gate insulating film 150 is formed on the gate wire 140. The first gate insulating film 150 insulates the data wire 120 from the gate wire 140, and simultaneously prevents impurities from flowing into the organic semiconductor layer 170, which has low chemical resistance and plasma resistance. The first gate insulating film 150 may contain at least one of $SiN_x$ and $SiO_x$, which have excellent durability.

The first gate insulating film 150 is formed with first insulating film contact hole 153 that exposes the gate pad 145. The first gate insulating film 150 further includes first insulating film contact hole 151, 152 to expose the connecting member 147, 149.

The second gate insulating film 155 is a thick organic film that is formed on the first gate insulating film 150. The gate insulating film 155 may contain at least one of Si polymer, azobis isobutiro nitile (AIBN), tetra butyl ortho titanate (Ti $(OBu)_4$), and butanol. The second gate insulating film 155 includes a second insulating film contact hole 158 to expose the gate pad 145, as well as the second insulating film contact hole 156, 157 to expose the connecting member 147, 149. Second insulating film contact holes 156, 157, and 158 are positioned corresponding to the first insulating film contact holes 151, 152 and 153.

The transparent electrode layer 160 is formed on the second gate insulating film 155. The transparent electrode layer 160 is connected through the first and second insulating film contact holes 151, 156 to the data line 121 by the connecting member 147. Transparent electrode layer 160 includes the source electrode 161 in partial contact with the organic semiconductor layer 170, a drain electrode 163 separated from the source electrode 161 by interposing the organic semiconductor layer 170 therebetween, and a pixel electrode 165 formed in the pixel area to be connected with the drain electrode 163.

The transparent electrode layer 160 further includes the data pad contacting member (contact) 167 to cover the connecting member 149 exposed through the first and second insulating film contact holes 152, 157, and a gate pad contacting member (contact) 169 to cover the gate pad 145 exposed by the first and second insulating film contact holes 153, 158.

The transparent electrode layer 160 comprises a transparent conductive material such as indium tin oxide (ITO) and/or indium zinc oxide (IZO), etc. The source electrode 161 is physically and electrically connected through the first and second insulating film contact holes 151, 156 to the data line 121, to receive an image signal. The drain electrode 163 is separated from the source electrode 161 by the channel area, designated A. Drain electrode 163, source electrode 161, channel area A, and gate electrode 143 form a TFT. The TFT functions as a switching and driving device for controlling and driving the operation of each pixel electrode 165.

The organic semiconductor layer 170 is formed in the channel area A. The organic semiconductor layer 170 is in partial contact with the source electrode 161 and drain electrode 163, while covering the channel area A. The organic semiconductor layer 170 may comprise pentacene having five benzene rings linked to each other, perylenetetracarboxlic dianhidride (PTCDA), oligothiopene, polythiophene, polythienylenevynylene, etc., and may also comprise one of the existing organic semiconductor materials.

The first passivation layer 180 is formed on the organic semiconductor layer 170. The first passivation layer 180 covers the organic semiconductor layer 170, and may be a thick organic film comprising fluoric-based polymer. Herein, poly tetra fluoro ethylene (PTFE), fluorinated ethylene propylene (FEP), poly fluoro alkoxy (PFA), ethylene tetra fluoro ethylene (ETFE), polyvinylidene fluoride (PVDF), etc., can be used as the fluoric-based polymer.

The second passivation layer 190 may be further formed on the first passivation layer 180. The second passivation layer 190 is used as a mask for patterning the organic semiconductor layer 170 and the first passivation layer 180, and also functions to protect the organic semiconductor layer 170, thereby improving the characteristics of the organic TFT. The second passivation layer 190 may be formed of ITO or IZO. When the second passivation layer 190 comprises ITO and/or IZO rather than Al, it has a relatively small stress with respect to the first passivation layer 180. As a result, the lifting phenomenon occurs much less frequently, thereby improving the characteristics of the organic TFT.

Meanwhile, although not shown, a passivation film may also be provided to cover an area from the first and second insulating film contact holes 151, 156 to the organic semiconductor layer 170. The passivation film may be a low temperature passivation film.

Hereinafter, referring to FIGS. 3A to 3K, a method for manufacturing a TFT substrate including an organic TFT will be described in detail.

Figure 3A:
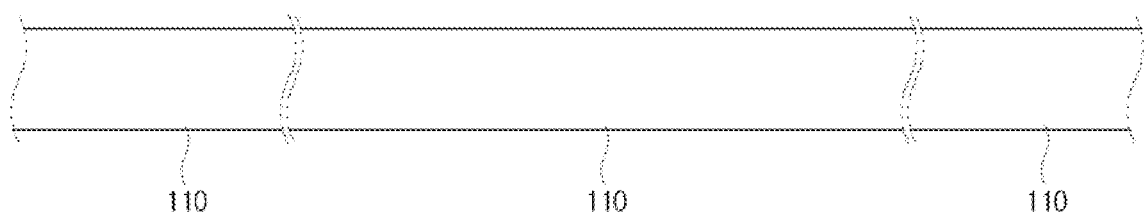

As shown in FIG. 3A, the insulating substrate 110 comprising an insulating material such as glass, quartz, ceramic, plastic, etc., is prepared. Preferably, a plastic substrate is used in fabricating a flexible TFT substrate.

Figure 3B:
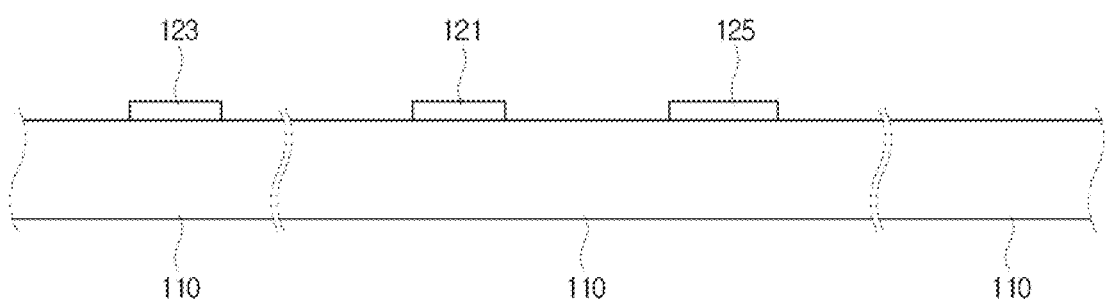

Then, as shown in FIG. 3B, a data wire material is deposited on the insulating substrate 110 using a sputtering method, etc. The data line 121, data pad 123 and the light shielding film 125 are formed using a photolithography process. In some embodiments, light shielding film 125 may be omitted.

Figure 3C:
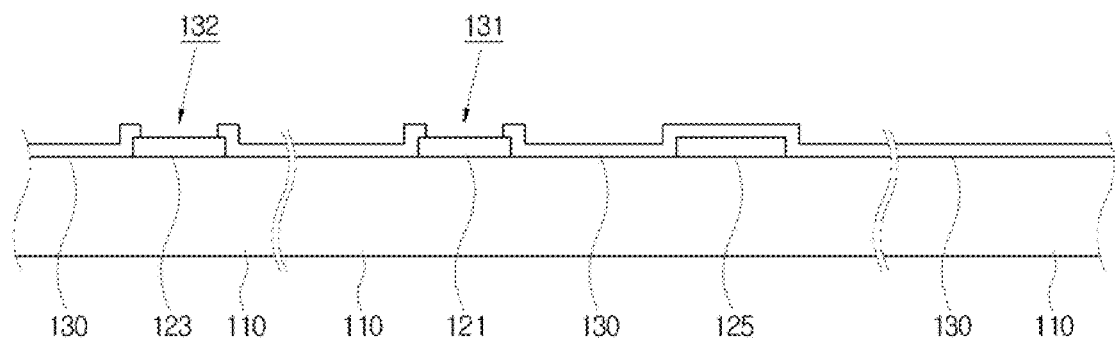

Additionally, as shown in FIG. 3C, a first buffer material comprising an inorganic material such as $SiN_x$, $SiO_x$, etc., is coated on the insulating substrate 110 and the data wire 120 to form the first buffer film 130. The first buffer film 130 may be formed by a process such as a chemical vapor deposition (CVD) process, a plasma enhanced chemical vapor deposition (PE-CVD) process, etc. The first buffer film contact hole 131, 132 to expose the data wire 120 is formed by an etching process using a photosensitive film as a shielding mask.

Figure 3D:
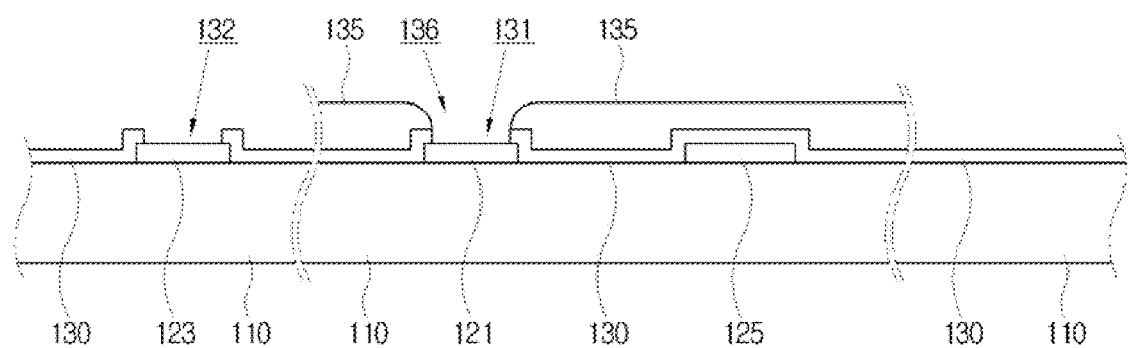

Then, as shown in FIG. 3D, a second buffer material is coated on the first buffer film 130 to form the second buffer film 135. However, the second buffer film 135 is not formed proximate to the non-displaying region in which the data pad 123 and the gate pad 145 are positioned. The second buffer film 135 may comprise at least one of acrylic-based resin, polyvinyl alcohol, benzocyclobutene, polyvinyl phenolic-based resin, fluoric-based polymer and polystyrene resin, and is formed by a spin coating or slit coating method, etc. The second buffer film contact hole 136 for exposing the data line 121 is formed by an etching process using a photosensitive film or the like as a shielding mask.

Figure 3E:
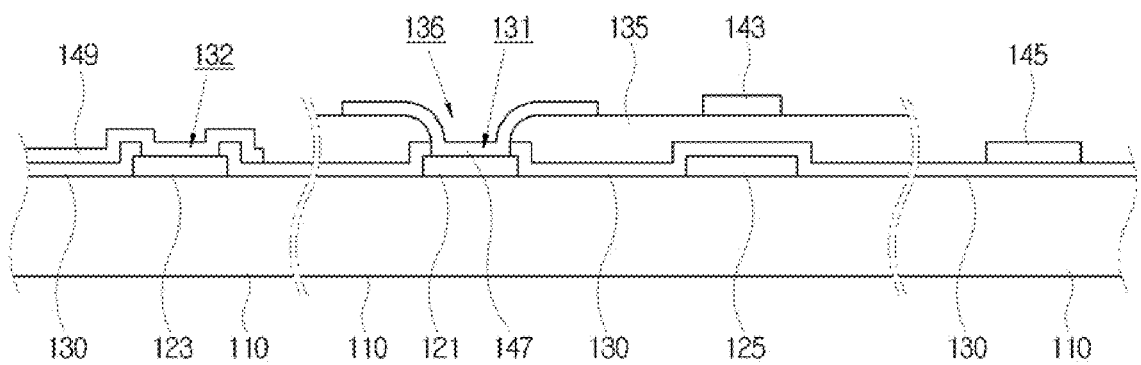

Next, as shown in FIG. 3E, after a gate wire material comprising at least one of Al, Cr, Mo, Au, Pt, Pd, Nd, etc., is deposited on the second buffer film 135 by a sputtering method, etc., the gate line 141, the gate electrode 143, gate pad 145 and the connecting member 147, 149 are formed using a photolithography process.

Figure 3F:
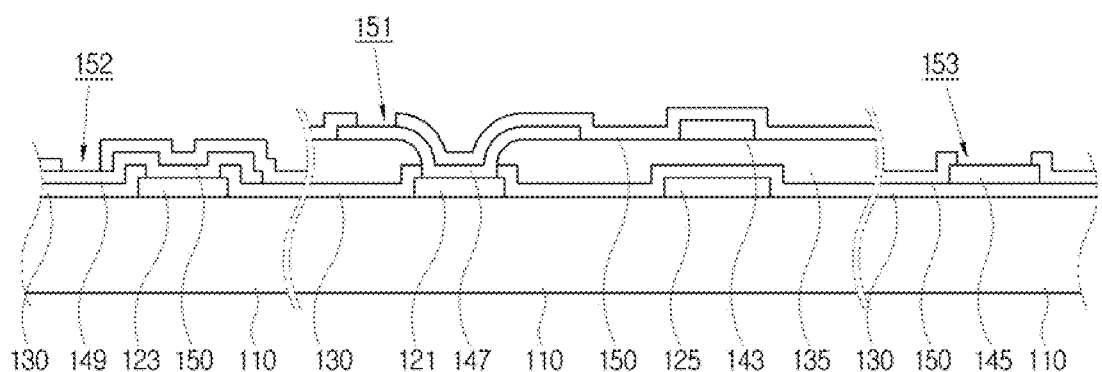

As shown in FIG. 3F, the first gate insulating film 150 comprising at least one of $SiN_x$, $SiO_x$ is formed on the gate wire 140 and the second buffer film 135. The first gate insulating film 150 may be formed by a CVD or PE-CVD method. The first insulating film contact hole 151, 152, 153 is formed by an etching process using a photosensitive film or the like as a shielding mask.

Figure 3G:
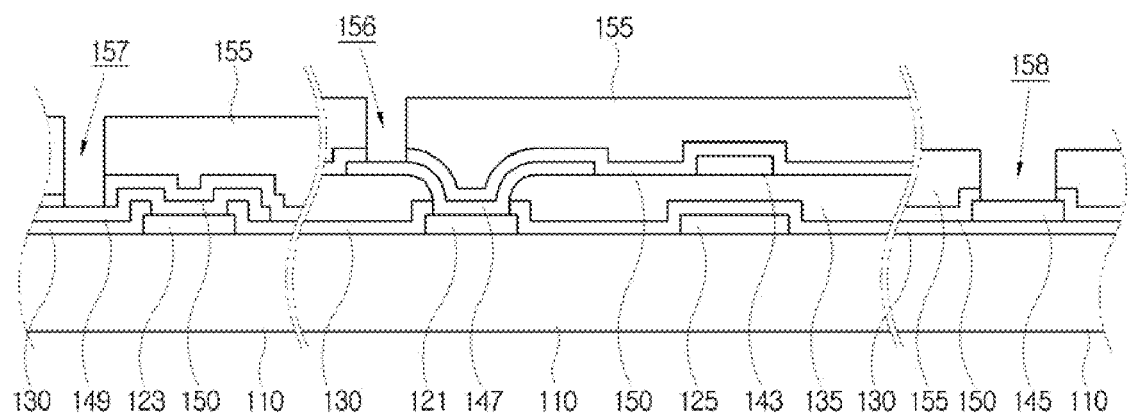

Additionally, as shown in FIG. 3G, the second gate insulating film 155 is formed on the first gate insulating film 150 as a thick organic film. The second gate insulating film 155 may comprise at least one of Si polymer, azobis isobutiro nitrile (AIBN), tetra butyl ortho titanate ($Ti(OBu)_4$), and butanol, and is formed by a spin coating or slit coating method, etc. Additionally, the second insulating contact hole 158 for exposing the gate pad 145 and the second insulating contact hole 156, 157 for exposing the connecting member 147, 149 are formed in the second gate insulating film 155 using an etching process. The positions of second insulating contact hole 158 and the second insulating contact hole 156, 157 correspond to the positions of first insulating film contact hole 151, 152, 153.

Figure 3H:
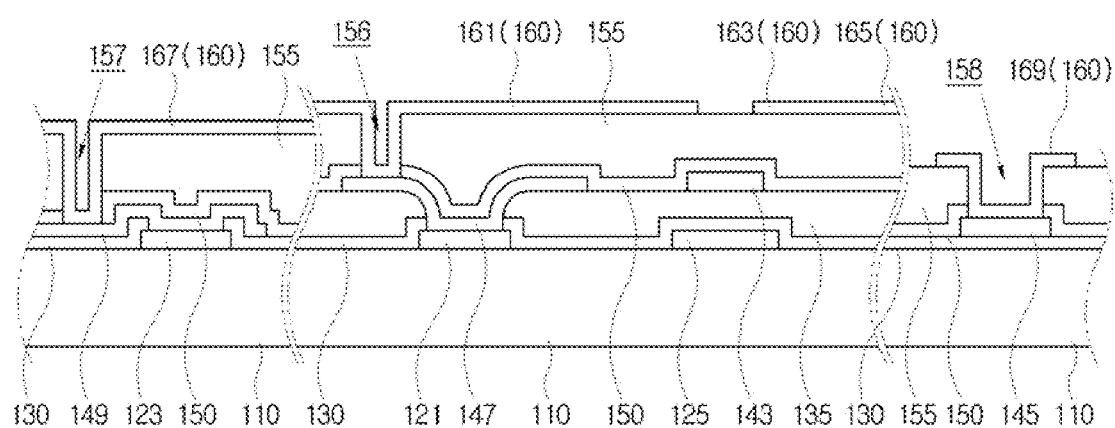
Figure 31:
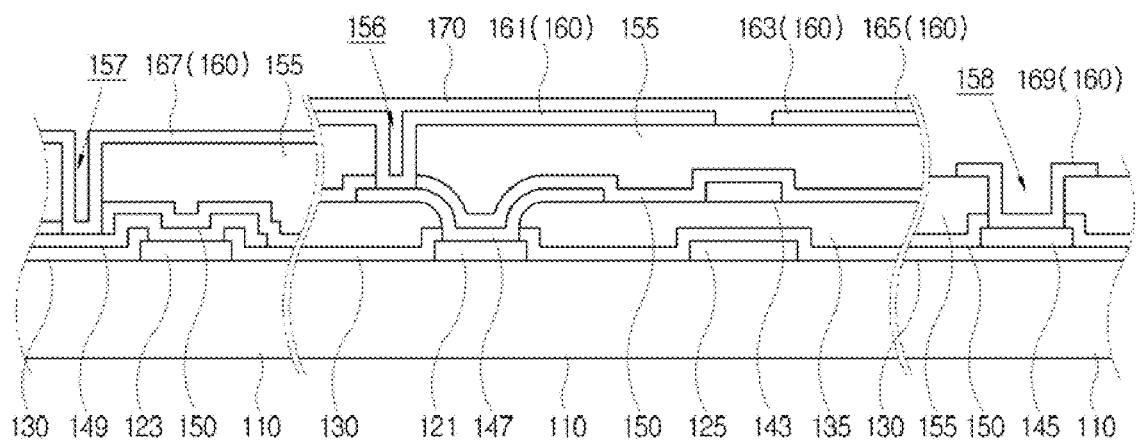

As shown in FIG. 3H, a transparent conductive metallic oxide material (transparent conductive material) such as ITO or IZO is coated on the first gate insulating film 150 using a sputtering method, and then the transparent electrode layer 160 is formed using a photolithography process and/or etching process.

The transparent electrode layer 160 is connected through the first and second insulating film contact holes 151, 156 to the data line 121. The transparent electrode layer 160 includes the source electrode 161 which is in at least partial contact with the organic semiconductor layer 170, the drain electrode 163 separated from the source electrode 161 by the organic semiconductor layer 170 therebetween and defining the channel area A, and a pixel electrode 165 positioned in the pixel area to be connected to the drain electrode 163. The transparent electrode layer 160 further includes the data pad contacting member 167 connected through the first and second insulating film contact holes 152, 157 to the data pad 123, as well as the gate pad contacting member 169 connected through the insulating film contact holes 153, 158 to the gate pad 145.

Then, as shown in FIG. 3I, an organic semiconductor solution is coated on the transparent electrode layer 160 to form the organic semiconductor layer 170. The organic semiconductor layer 170 may be formed by an evaporation or coating method. The organic semiconductor layer 170 may be formed in a displaying region, but not in a non-displaying region proximate the data pad 123 and the gate pad 145.

Figure 3J:
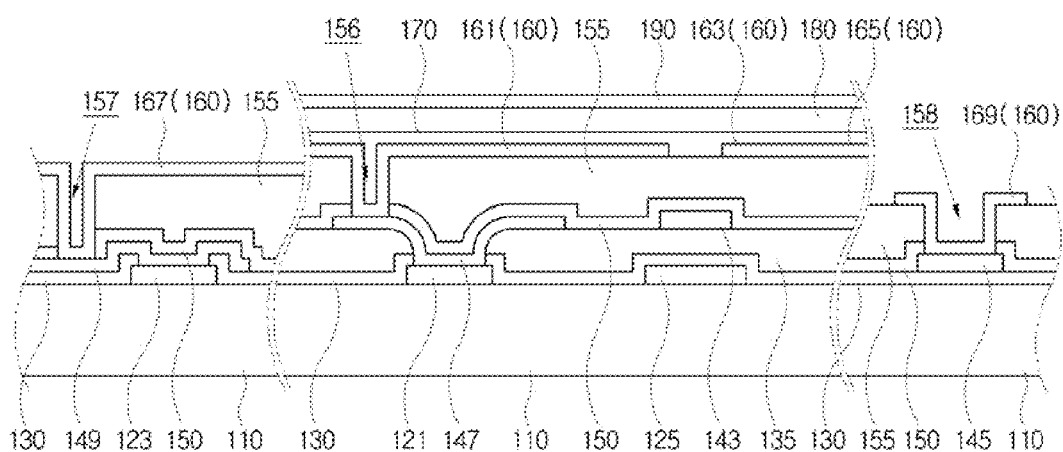

As shown in FIG. 3J, the first passivation layer 180 including fluoric-based polymer is formed on the organic semiconductor layer 170 by a spin coating or slit coating method. The first passivation layer 180 may be formed in the displaying region, but not in a non-displaying region proximate the data pad 123 and the gate pad 145.

Additionally, the second passivation layer 190 comprising at least one of ITO and IZO is formed on the first passivation layer 180 by a sputtering method.

Figure 3K:
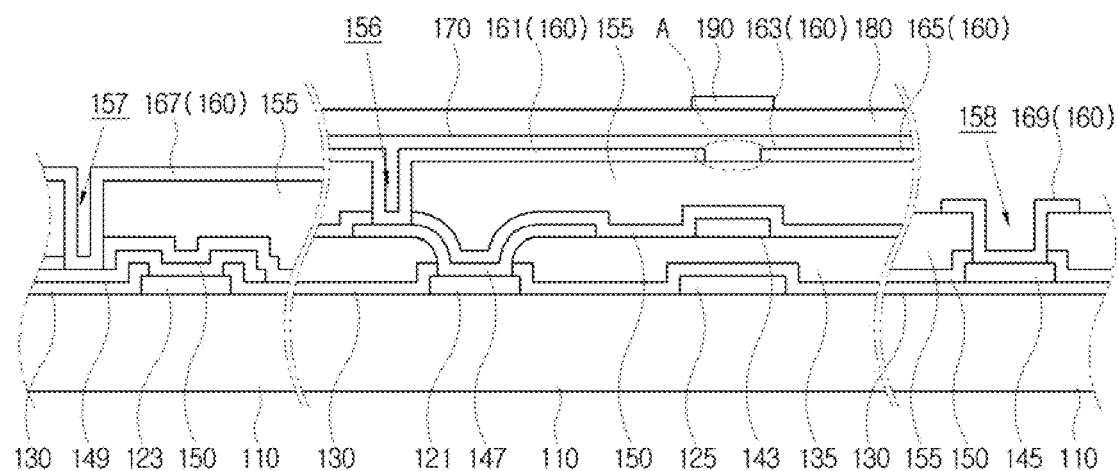

As shown in FIG. 3K, the second passivation layer 190 is patterned using a photolithography process so second passivation layer 190 remains at a position corresponding to the channel area A.

Subsequently, the organic semiconductor layer 170 and the first passivation layer 180 are patterned at the same time by an etching process using the patterned second passivation layer 190 as a shielding mask, thereby forming the organic TFT as shown in FIG. 2.

Meanwhile, although not shown, a passivation film may be further provided to cover a region from the first and second insulating film contact holes 151, 156 to the organic semiconductor layer 170. The passivation film may be a low temperature passivation film.

Figure 4A:
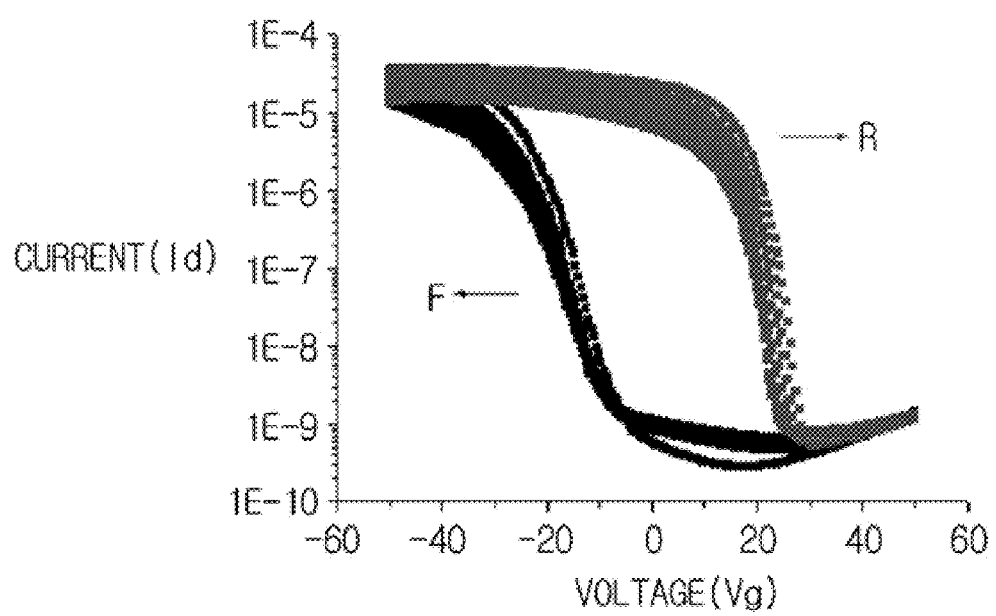
FIG. 4A is a graph showing a hysteresis characteristic of an organic TFT when using a single gate insulating film.
Figure 4B:
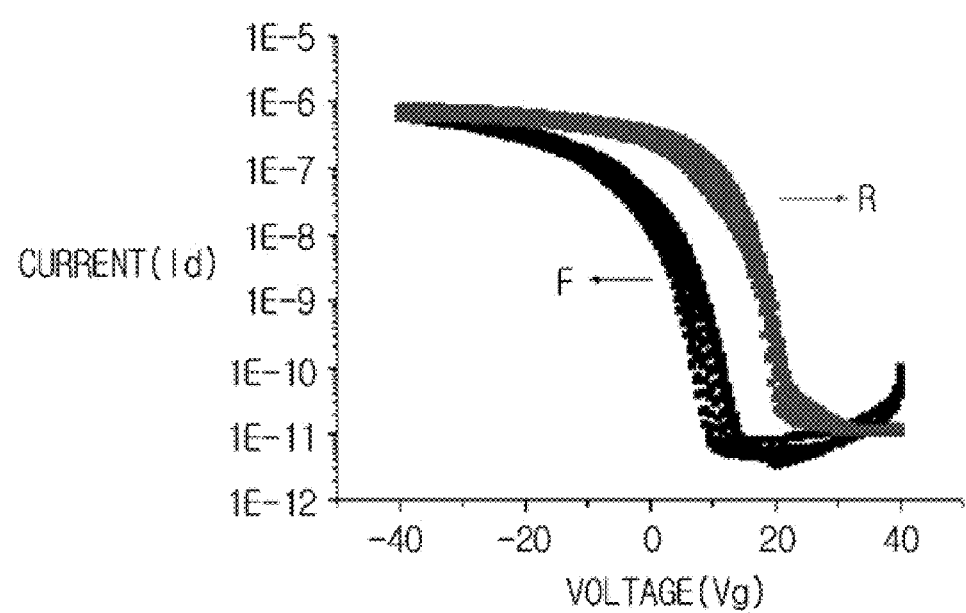
FIG. 4B is a graph showing the hysteresis characteristic of the organic TFT when using a dual gate insulating film according to the first embodiment of the present invention.
Figure 5:
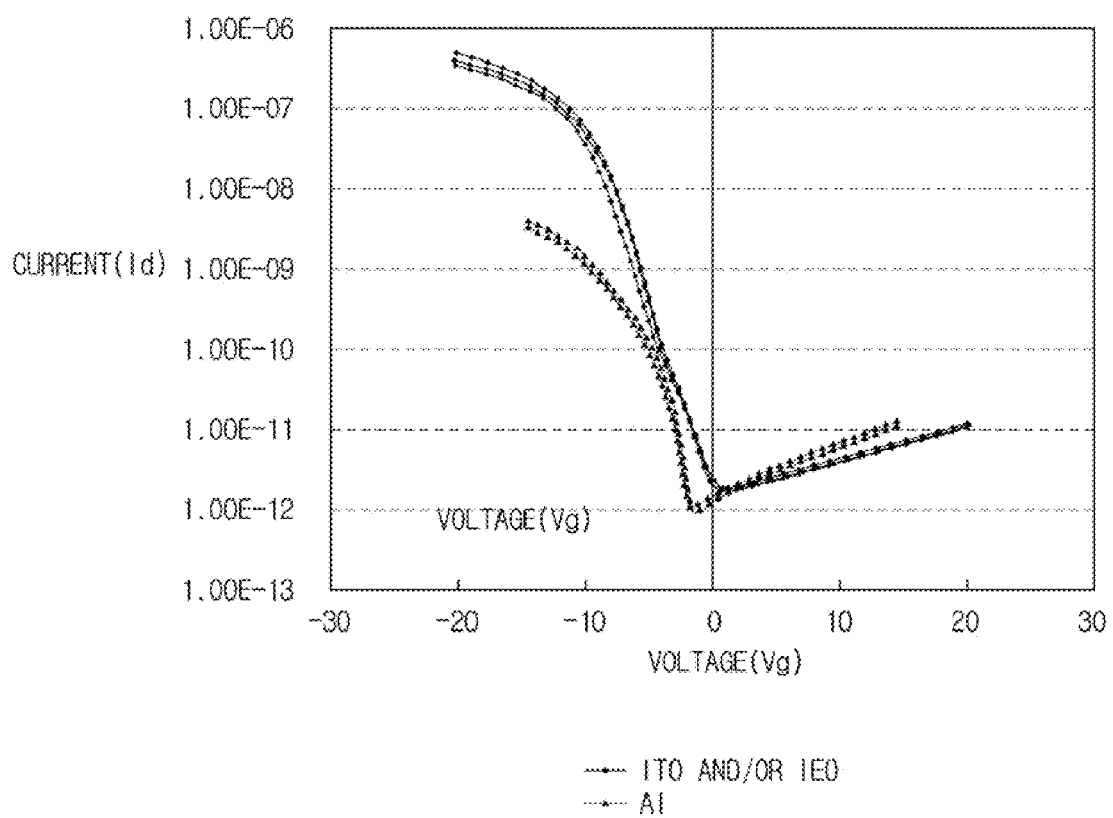
FIG. 5 is a graph showing the hysteresis characteristic of the organic TFT when using a second passivation layer formed of ITO or IZO according to the first embodiment of the present invention.

Referring to FIGS. 4A to 5, an operation and effect of the organic TFT according to the first embodiment of the present invention, as described above, will be described.

FIG. 4A is a graph showing a hysteresis characteristic of the drain current versus gate voltage for an organic TFT in which a single gate insulating film is used. By contrast, FIG. 4B is a graph showing the hysteresis characteristic of the organic TFT when using a dual gate insulating film, according to the above-described first embodiment of the present invention. The gate insulating film used in FIG. 4A is formed of the same material as that of the second gate insulating film 135 of the first embodiment. It shows a large difference between a value of the drain current when increasing a gate voltage (F) compared to the associated value of the drain current when reducing the gate voltage (R). This means that a defect in a fabricating process or material of the TFT has occurred, and thus the reproducibility of the organic TFT is not good. That is, the defect occurs because an insulating property of the gate insulating film 135 is poor.

However, as shown in FIG. 4B, when the embodiment in which a dual gate insulating film 130, 135 including an organic film and an inorganic film is used, there is a relatively small difference between the value of the drain current obtained when increasing the gate voltage (F) and the value obtained when reducing the gate voltage (R). This means that the defect in the fabricating process or material of the TFT is reduced, and thus the reproducibility of the organic TFT is improved. That is, the insulating property is improved by using the dual gate insulating film 130, 135, and thus the hysteresis characteristic of the organic TFT is improved.

FIG. 5 is a graph showing a drain current value as a function of the gate voltage value for an embodiment in which the second passivation layer 190 is formed of ITO or IZO, versus the case in which second passivation layer 190 is formed of Al. In FIG. 5, the lines indicated by circular points show the drain current values as a function of the gate voltage values of the organic TFT having the second passivation layer 190 containing at least one of ITO and IZO, while the lines indicated by triangular points shows the drain current values as a function of the gate voltage values of the organic TFT having the second passivation layer 190 containing Al.

Generally, the hysteresis characteristic of TFT can be indicated as fellows:

$$\frac{I_{on}}{I_{off}} = \left(\frac{\mu}{\sigma}\right)\left(\frac{C_o^2}{qN_A t^2}\right)V_D^2$$

wherein $I_{on}$ is a maximum current value, $I_{off}$ is an off-state leakage current, $\mu$ is a charge mobility, $\sigma$ is a conductivity of a thin film, q is a quantity of electric charge, $N_A$ is a charge density, t is a thickness of a semiconductor film, $C_O$ is an electrostatic capacitance of an oxide film, and $V_D$ is a drain voltage.

As shown in FIG. 5, it shows that a current ratio ($I_{on}/I_{off}$) of the organic TFT having the second passivation layer 190 containing at least one of ITO and IZO is greater than that of the organic TFT having the conventional second passivation layer 190 containing Al. The large current ratio ($I_{on}/I_{off}$) means a small current leakage, and this also means that the hysteresis characteristic of the TFT is improved.

Hereinafter, a second embodiment of the present invention will be described with reference to FIG. 6. In the second embodiment, the same reference numbers are given to the same/similar elements as those in the first embodiment, and descriptions thereof may be omitted.

Figure 6:
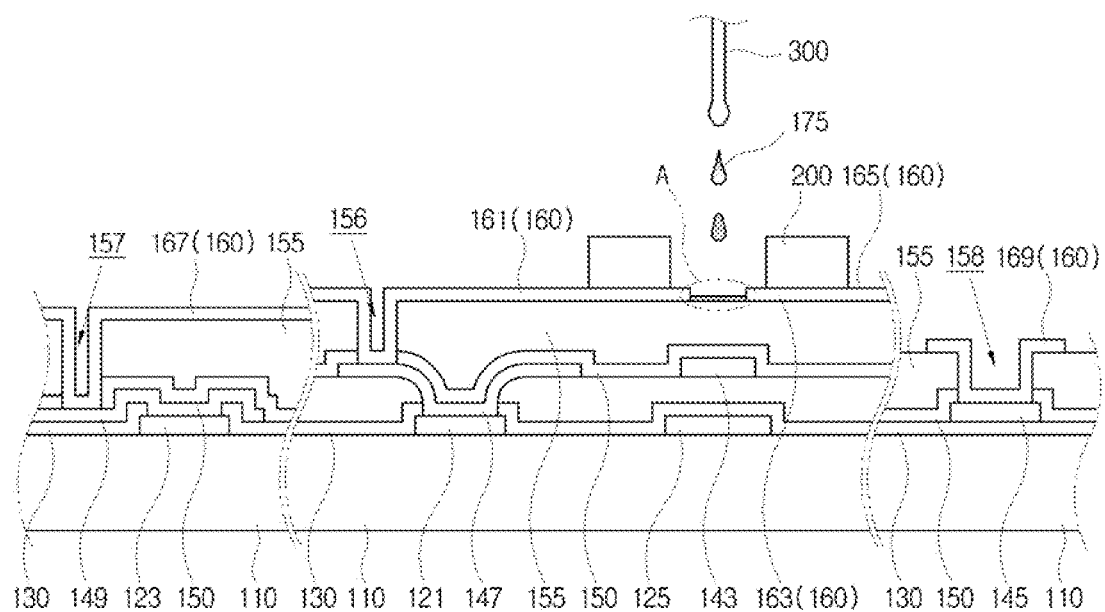
FIG. 6 is a cross-sectional view of a TFT substrate according to the second embodiment of the present invention.

FIG. 6 is a cross-sectional view schematically showing a step of a fabricating process of the TFT according to the second embodiment of the present invention. In the first embodiment, the organic semiconductor layer 170 is fabricated by an evaporation method and a photolithography process. However, in the second embodiment, it is fabricated by an inkjet method.

As shown in FIG. 6, a partition wall 200 is formed. Partition wall 200 functions to enclose the channel area A defined by the source electrode 161 and the drain electrode 163, including at least an exposed portion of each of the source electrode 161 and the drain electrode 163. The partition wall 200 includes a photosensitive organic material, and is formed by an exposing and developing process. Partition wall 200 may also be formed by other processes.

An organic semiconductor material 175 is provided (jetted) through a nozzle 300 to the channel area A enclosed by the completed partition wall 200. The organic semiconductor material may be aqueous or oleaginous, depending on a solvent to be used. The organic semiconductor material is then treated using a solvent removing process to form the organic semiconductor layer 170.

Then, a first passivation layer solution is jetted on the organic semiconductor layer 170. The first passivation layer solution may be aqueous or oleaginous, depending on a solvent to be used. The first passivation layer solution is treated using a solvent removing process to form the first passivation layer 180. The first passivation layer 180 has a substantially flat surface.

As shown in FIG. 2, the organic TFT is fabricated by the above-described process. A TFT substrate including the organic TFT may be incorporated in a display device. For example, a TFT substrate is included in display devices such as liquid crystal display devices, organic electroluminescent display devices, or inorganic electroluminescent display devices, which may be fabricated according to well-known methods.

In the above-described method for fabricating the TFT substrate 100 according to embodiments of the present invention, since the organic semiconductor layer 170 and the first passivation film 180 are formed using an inkjet method, the fabricating process is relatively simple compared to the conventional method. Furthermore, since the described methods omit conventional processes using plasma or harmful chemical materials after forming the organic semiconductor layer 170, the described methods may reduce the deterioration of the hysteresis characteristic of the organic semiconductor layer 170 compared to some conventional fabrication processes.

As described above, the present invention provides a TFT substrate in which the hysteresis characteristic of the organic TFT is improved.

Further, the present invention provides methods for fabricating the TFT substrate in which the hysteresis characteristic of the organic TFT is improved.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A thin film transistor substrate, comprising:
   an insulating substrate;
   a data wire formed on the insulating substrate;
   a gate wire formed on the data wire;
   a gate insulating layer formed on the gate wire and having a gate insulating layer contact hole positioned to expose at least a part of the gate wire;
   a source electrode and a drain electrode formed on the gate insulating layer and being separated from each other to define a channel area;
   an organic semiconductor layer formed in the channel area;
   a first passivation layer formed on the organic semiconductor layer and comprising fluoric-based polymer; and
   a second passivation layer formed on the first passivation layer and comprising a transparent conductive material.

2. The thin film transistor substrate as set forth in claim 1, wherein the second passivation layer comprises at least one of ITO and IZO.

3. The thin film transistor substrate as set forth in claim 1, wherein the gate wire comprises a gate line extending in one direction on the insulating substrate,
- a gate pad formed at an end of the gate line,
- a gate electrode formed at a position corresponding to the organic semiconductor layer, and
- a connector covering the gate insulating layer contact hole.

4. The thin film transistor substrate as set forth in claim 3, wherein the data wire includes a data line crossing the gate line and defining a pixel area, and a data pad formed at an end of the data line.

5. The thin film transistor substrate as set forth in claim 4, further comprising a first buffer layer comprising an inorganic material formed between the data wire and the gate wire and having a first buffer layer contact hole to expose at least a part of the data line and the data pad.

6. The thin film transistor substrate as set forth in claim 5, further comprising a second buffer layer comprising an organic material formed between the first buffer layer and the gate wire, and having a second buffer layer contact hole to expose the data line.

7. The thin film transistor substrate as set forth in claim 4, further comprising a data pad contact connected with the data pad through the connector, and a gate pad contact covering the gate pad exposed by the gate insulating layer contact hole.

8. The thin film transistor substrate as set forth in claim 1, wherein the gate insulating layer comprises a first gate insulating layer formed on the gate wire and a second gate insulating layer formed on the first gate insulating layer,
- wherein the gate insulating layer contact hole comprises a first gate insulating layer contact hole positioned to expose at least a part of the gate wire and a second gate insulating layer contact hole positioned corresponding to the first gate insulating layer contact hole.

9. The thin film transistor substrate as set forth in claim 8, wherein the first gate insulating layer comprises an inorganic material and includes the first gate insulating layer contact hole,
- wherein the second gate insulating layer comprises an organic material and includes the second gate insulating layer contact hole.

* * * * *